United States Patent
Lou et al.

[19]

[11] Patent Number: 6,153,540
[45] Date of Patent: *Nov. 28, 2000

[54] METHOD OF FORMING PHOSPHOSILICATE GLASS HAVING A HIGH WET-ETCH RATE

[75] Inventors: Ishing Lou, Mountain View; Cary Ching, Sunnyvale; Peter W. Lee, San Jose; Rong Pan, San Francisco; Paul Gee, San Jose; Francimar Campana, Milpitas, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/034,850

[22] Filed: Mar. 4, 1998

[51] Int. Cl.$^7$ ..................................................... H01L 21/31
[52] U.S. Cl. .......................... 438/778; 438/787; 438/788
[58] Field of Search ..................... 438/778, 779, 438/787, 788; 427/585

[56] References Cited

U.S. PATENT DOCUMENTS

| | | | |
|---|---|---|---|
| 5,104,482 | 4/1992 | Monkowski | 438/698 |
| 5,272,880 | 12/1993 | Nishizato et al. | 62/50.7 |
| 5,354,387 | 10/1994 | Lee et al. | 438/784 |
| 5,436,187 | 7/1995 | Tanigawa | 437/52 |
| 5,478,769 | 12/1995 | Lim | 437/52 |
| 5,480,824 | 1/1996 | Jun | 437/52 |
| 5,482,886 | 1/1996 | Park et al. | 437/60 |
| 5,501,998 | 3/1996 | Chen | 437/52 |
| 5,597,756 | 1/1997 | Fazan et al. | 437/52 |
| 5,639,689 | 6/1997 | Woo | 437/193 |
| 5,644,153 | 7/1997 | Keller | 257/324 |
| 5,648,175 | 7/1997 | Russell et al. | 428/472.3 |
| 5,656,536 | 8/1997 | Wu | 438/397 |
| 5,716,890 | 2/1998 | Yao | 438/784 |
| 5,807,792 | 9/1998 | Hg et al. | 438/778 |
| 5,814,377 | 9/1998 | Robles et al. | 438/788 |

FOREIGN PATENT DOCUMENTS 0 412 644  2/1991  European Pat. Off. ...... H01L 21/316

OTHER PUBLICATIONS

W. Ong, et al., "Sub–Atomospheric Chemical Vapor Deposition of Phosphosilicate Glass: Gap Fill and Film Properties as a Function of Dopant Source" Extended Abstract, vol. 93/1, Jan. 1993, p. 443–444, XP000431770.

Shioya et al., "Comparison of Phosphosilicate Glass Films Deposited by Three Different Chemical Vapor Deposition Methods" Journal of the electrochemical Society, vol. 133, No. 9, Sep. 1986, pp. 1943–1950, XP002107141 Manchester, New Hampshire US.

Robles et al., "Gap Fill and Film Reflow Capability of Subatmospheric Chemical Vapor Deposited Borophosphosilicate Glass" Journal of the Electrochemical Society, Apr. 1996, Electrochem. Soc, USA, vol. 143, No. 4, pp. 1414–1421, XP002107142 ISSN 0013–4651.

D. P. Poenar et al, "Infrared Spectroscopic Analysis of Phosposilicate Glass Films for Micromaching", *J. Electrochem. Soc.*, vol. 143, No. 3, Mar. 1996, pp. 968–973.

*Primary Examiner*—Benjamin L. Utech
*Assistant Examiner*—Duy-Vu Deo
*Attorney, Agent, or Firm*—Townsend Townsend & Crew

[57] ABSTRACT

A method and apparatus for controlling the wet-etch rate and thickness uniformity of a dielectric layer, such as a phosphosilicate glass layer (PSG) layer. The method is based upon the discovery that the atmospheric pressure at which a PSG layer is deposited affects the wet-etch rate of the same, during a subsequent processing step, as well as the layer's thickness uniformity. As a result, the method of the present invention includes the step of pressurizing the atmospheric pressure of a semiconductor process chamber within a predetermined range after the substrate is deposited therein. Flowed into the deposition zone is a process gas comprising a silicon source, all oxygen source, and a phosphorous source; and maintaining the deposition zone at process conditions suitable for depositing a phosphosilicate glass layer on the substrate.

14 Claims, 9 Drawing Sheets

METHOD OF FORMING PHOSPHOSILICATE GLASS HAVING A HIGH WET-ETCH RATE

BACKGROUND OF THE INVENTION

The present invention relates to semiconductor processing. Specifically, the present invention relates to a process and apparatus for producing phosphosilicate glass having a high wet-etch rate ideally suited for manufacturing integrated circuits.

In the current evolution of integrated circuits there exists a constant drive to reduce the per unit cost of the circuits. This has led to a great increase in circuit density on a given substrate, and a reduction in the size of the circuit's features. However, reducing the feature size of certain integrated circuits poses significant challenges due to the electrical characteristics of the same. For example, reducing the feature dimensions of the storage capacitors associated with dynamic random access memory (DRAM) integrated circuits poses a significant challenge.

A typical DRAM consists of an array of individual cells, each of which stores a unit of data (bit) and includes a charge-passing transistor and a storage capacitor. As shown in FIG. 1, a typical prior art cylindrically shaped storage capacitor, associated with a DRAM device, is formed on a semiconductor substrate 11 having disposed thereon a field oxide region 12 for device isolation, a gate oxide layer 13, a gate electrode 14 and source/drain regions 15. Atop the aforementioned structure is an interlayer insulation film 16 having a bit line 17 formed therein. To form the storage capacitor, a planarization layer 18 is formed atop both the bit line and the insulation film 16. The planarization layer 18 typically consists of borophosphosilicate glass (BPSG). An oxide layer 19 is formed atop of the planarization layer 18. Thereafter, the oxide layer 19, the planarization layer 18 and the interlayer insulation film 16 are, in sequence, removed at an area where the storage electrode contact is to be formed, defining a storage electrode contact hole 20. A first polysilicon layer is deposited to fill the contact hole 20, followed by formation of a sacrificial layer 22 on the polysilicon of the contact hole 20. The sacrificial layer 22 is formed from an oxide and functions as a mask so that the first polysilicon layer may be etched to form a first polysilicon pattern 21.

Referring to FIG. 2, a second polysilicon layer 23 is formed. The second polysilicon layer 23 covers the oxide layer 19, sacrificial layer 22, and the first polysilicon pattern 21.

Referring to FIG. 3, the second polysilicon layer 23 is subjected to anisotropic etch which removes the sacrificial layer 22 and the oxide 19 to form a polyspacer 24. As a result, a cylindrical storage electrode 25 is formed consisting of the polysilicon pattern 21 and the polyspacer 24.

Reducing the size of the capacitor has deleterious affects on the proper functioning of the DRAM device. The proper functioning of the DRAM integrated circuit requires that the capacitor obtain a sufficient charge to maintain an acceptable signal-to-noise ratio. The charge a capacitor can store is proportional to the capacitor's size. These factors place a significant limit on the reduction in size of the storage capacitor, thereby limiting the reduction in per unit cost of the DRAM. As a result, storage capacitors on a DRAM device occupy most of the device's area. U.S. Pat. Nos. 5,478,769; 5,480,824; 5,482,886; 5,501,998 each describes prior art attempts to reduce the overall size of the storage capacitor, while maintaining, or increasing, the charge per unit area stored thereby. A drawback with the prior art attempts to reduce the size of the storage capacitor is that each increases the time and complexity of the processes for manufacturing the storage capacitor.

Other attempts to reduce the per unit cost of integrated circuits has focused on a reduction in processing time. One such attempt includes forming certain layers, such as sacrificial layer 22, from materials having a high etch rate. This decreases the time necessary to remove the layer, thereby reducing the time necessary to manufacture the integrated circuit. An important characteristic of sacrificial layers is that they be deposited with a substantially uniform thickness. This facilitates control of the feature dimensions and, therefore, operation of the device once constructed. However, sacrificial layers of the prior art typically suffer from either poor thickness uniformity or poor etch rates.

What is needed, therefore, is a process and apparatus that reduces the time required to manufacture an integrated circuit by providing a sacrificial layer having improved etch rate characteristics and thickness uniformity.

SUMMARY OF THE INVENTION

The present invention provides a method and apparatus that enables manufacturing integrated circuits, such as a DRAM, at a decreased per unit cost by decreasing the time required to manufacture the same. Specifically, a method is provided by which to form a sacrificial layer, from phosphosilicate glass (PSG), having a high wet-etch rate and excellent thickness uniformity. The invention is based upon the discovery that both the wet-etch rate and the thickness uniformity of a PSG layer are dependent upon the pressure present when the PSG layer is deposited.

The method of the present invention includes placing a substrate proximate to the deposition zone of a semiconductor process chamber; flowing into the deposition zone a process gas including a silicon source, an oxygen source, and a phosphorous source; establishing a wet-etch rate of the PSG by pressurizing the process chamber to a predetermined pressure level; and maintaining the deposition zone at process conditions suitable for depositing a phosphosilicate glass layer on the substrate.

An exemplary embodiment of the method in accordance with the present invention the substrate has a doped polysilicon layer disposed thereon. The silicon source is vaporized tetraethylorthosilane (TEOS), the phosphorous source is vaporized triethylphosphate (TEPO), the oxygen source is ozone gas and a helium carrier gas is included. The TEOS is flowed into the deposition zone at a rate in the range of 700 to 1,500 sccm, with 1,200 sccm being preferred. The TEPO gas is flowed into the deposition zone at the rate in the range of 30 to 150 sccm, with 80 sccm being preferred. The ozone gas is flowed into the deposition at a rate in the range of 3,000 to 6,000 sccm, with 4,000 sccm being preferred. The helium gas is flowed into the deposition zone at a rate in the range of 2,000 to 6,000 sccm, with 4,000 sccm being preferred. If desired, however, a mixture of He/$N_2$ gases may be substituted for the pure helium carrier gas. In this fashion, helium gas and nitrogen gas are flowed into the deposition zone at the same rate, in the range of 1,000 to 3,000 sccm. The temperature of the deposition zone is in the range of 350° C. to 500° C., with 480° C. being preferred. The pressure is maintained within a critical range so as not to exceed 400 torr to control the wet-etch rate of the PSG layer. Significantly improved thickness uniformity, if desired, is obtained by ensuring that the pressure level is maintained within a critical range so as to be no less than 125 Torr and no greater than 400 torr. Specifically, it was discovered that by varying the pressure within this range, the wet-etch rate of the PSG layer formed could be varied, while maintaining excellent thickness uniformity at a suitable deposition rate. In this fashion, a PSG layer with a substantially improved wet-etch rate may be formed. This reduces the time necessary to manufacture the same, thereby reducing the per unit cost of manufacturing integrated circuits, such as DRAMs.

These and other embodiments of the present invention, as well as its advantages and features are described in more detail in conjunction with the text below and attached figures.

DETAILED DESCRIPTION OF THE SPECIFIC EMBODIMENTS

I. Exemplary CVD System

Figure 4:
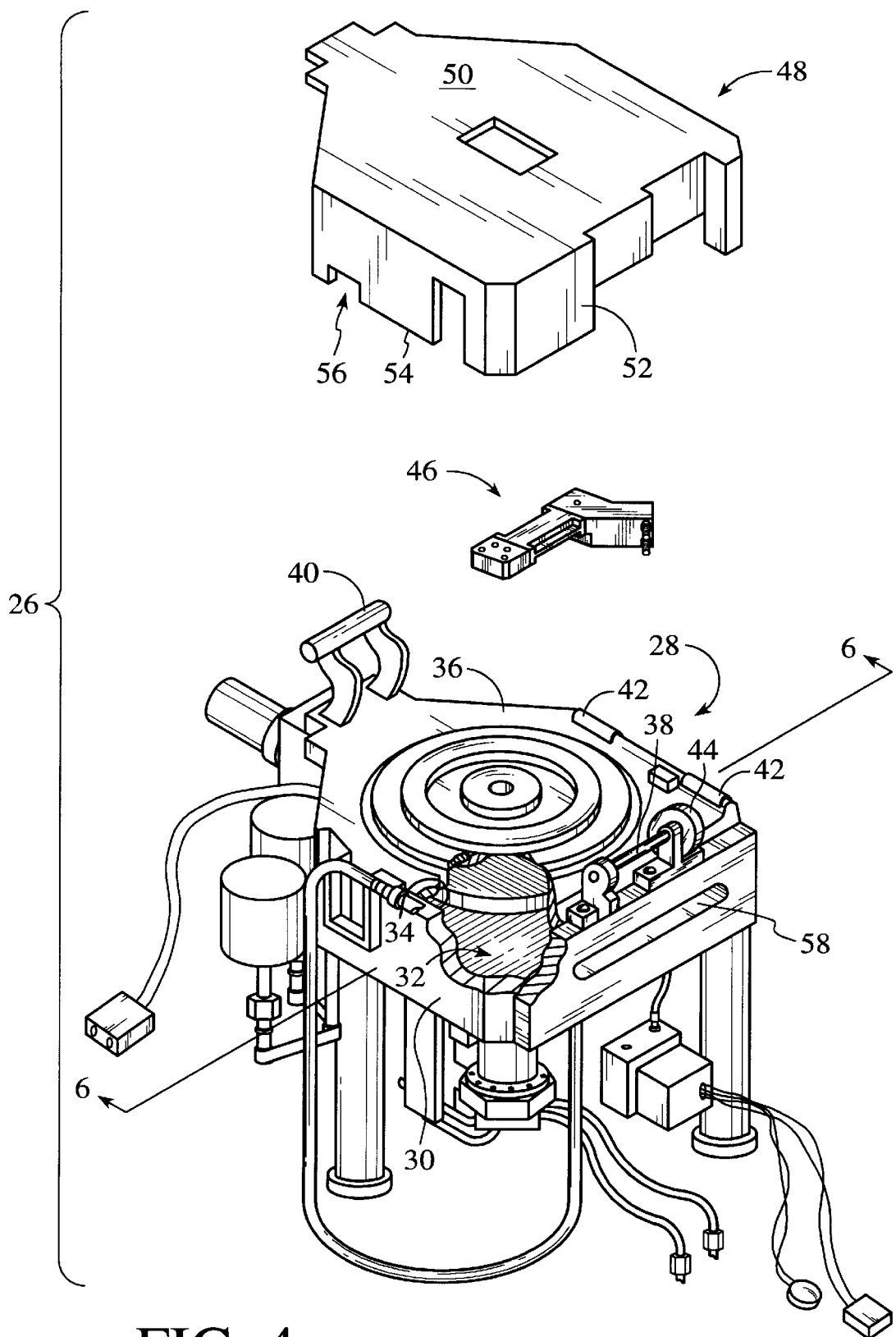
FIG. 4 is vertical view of one embodiment of a chemical vapor deposition (CVD) apparatus according to the present invention.

Referring to FIG. 4, a suitable chemical vapor deposition (CVD) apparatus 26 in which the method of the present invention can be carried out is shown as including an enclosure assembly 28 formed from a process-compatible material, such as aluminum or anodized aluminum. The enclosure assembly 28 includes a housing 30, defining a process chamber 32 with an opening 34, and a vacuum lid 36. The vacuum lid 36 is pivotally coupled to the housing 30 via a hinge 38 to selectively cover the opening 34. A handle 40 is attached to the vacuum lid 36, opposite to the hinge 38. The handle 40 facilitates moving the vacuum lid 36 between opened and closed positions. In the opened position, the opening 34 is exposed, allowing access to the process chamber 32. In the closed position, the vacuum lid 36 covers the opening 34, forming a fluid-tight seal therewith. To that end, lid clamps 42 may be employed to resiliently bias the vacuum lid 36 against the housing 30. The hinge 38, however, includes a locking ratchet mechanism 44 to prevent the vacuum lid 36 from unintentionally moving into the closed position.

A gas distribution assembly 46 is typically attached to the vacuum lid 36. The gas distribution assembly 46 delivers reactive and carrier gasses into the process chamber 32, discussed more fully below. A cover 48 is in superimposition with the vacuum lid 36 and adapted to enshroud the gas distribution assembly 46. To that end, the cover 48 includes a cover portion 50 lying in a plane that extends parallel to a plane in which the vacuum lid 36 lies. A side wall 52 extends from the cover portion 50, terminating in a periphery 54. The contour of the periphery 54 typically matches the contour of the components of the apparatus 26 disposed on the vacuum lid 36. For example, the periphery 54 may include recessed portions 56 that are positioned to receive one of the lid clamps 42 when the cover 48 is seated against the vacuum lid 36. To facilitate access to the process chamber 32, without compromising the fluid-tight seal between the vacuum lid 36 and the housing 30, a slit valve opening 58 is present in the housing 30, as well as a vacuum lock door (not shown). The slit valve opening 58 allows transfer of a wafer (not shown) between the process chamber 32 and the exterior of the apparatus 26. The aforementioned transfer may be achieved by any conventional wafer transfer assembly (not shown). An example of a conventional robotic wafer transfer assembly is described in commonly assigned U.S. Pat. No. 4,951,601 to Maydan, the complete disclosure of which is incorporated herein by reference.

Figure 5:
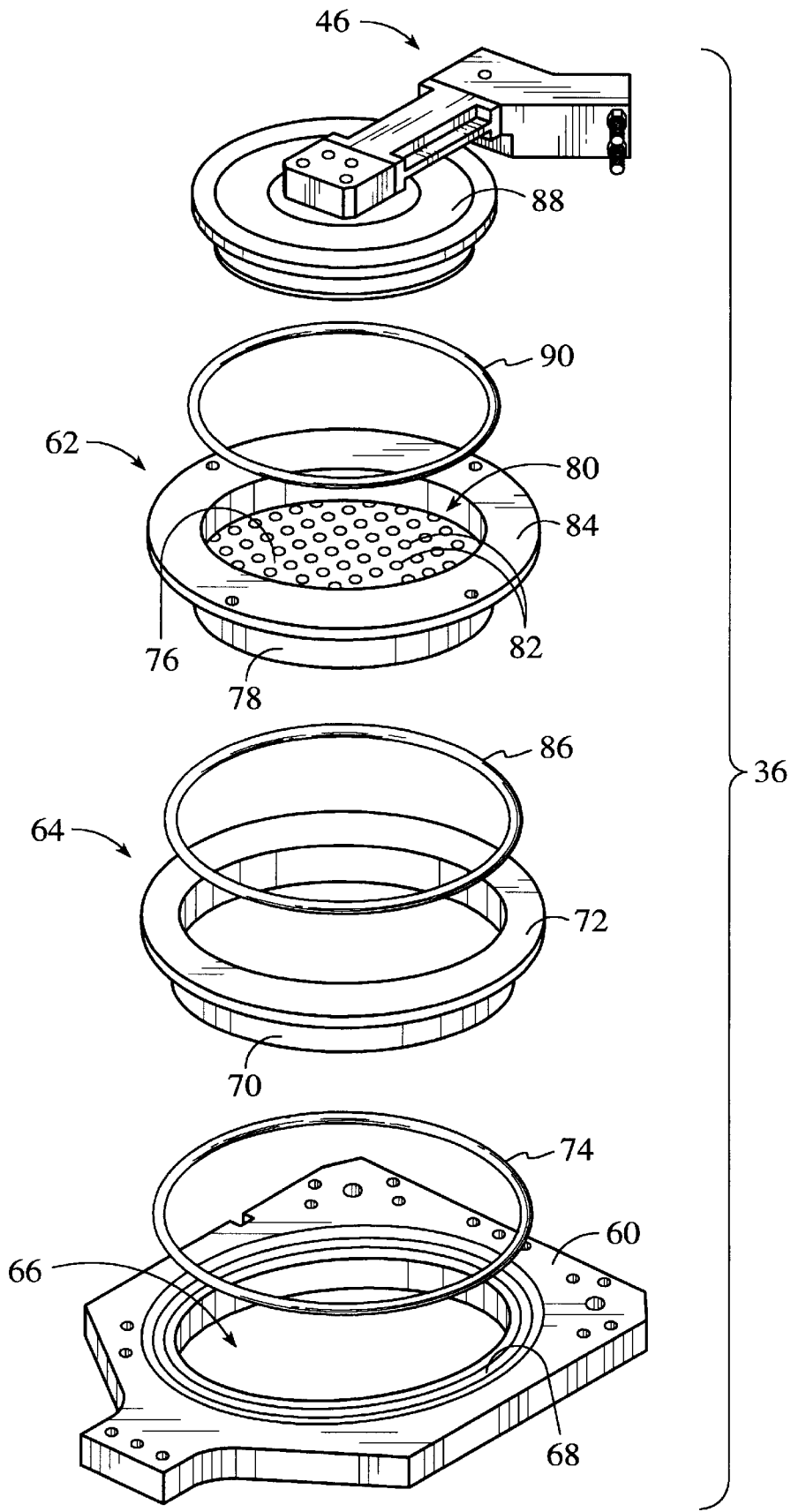
FIG. 5 is an exploded perspective view of a lid employed on the CVD apparatus shown in FIG. 4.

Referring to FIG. 5, the vacuum lid 36 includes a base plate 60, a gas distribution plate 62 and a sleeve 64. The base plate 60 has a centrally disposed aperture 66 and a recessed periphery 68 surrounding the aperture 66. The sleeve 64 has a shape complementary to the shape of the aperture 66 so as to fit therein. Typically, the sleeve 64 includes a cylindrical wall 70, which fits into the aperture 66, with a circular flange 72 extending from one end. The circular flange 72 seats against the recessed periphery 68 when the sleeve 64 is placed in a final seating position. To maintain fluid-tight integrity between the sleeve 64 and the base plate 60, a sealing member 74, such as gasket, is positioned between the recessed periphery 68 and the circular flange 72. The gas distribution plate 62 includes a circular base surface 76 and an annular side surface 78 extending from, and transversely to, the base surface 72, terminating in opening 80. A plurality of apertures 82 are formed in the circular base surface 76. An annular flange 84 extends from the opening 80 and transversely to the annular side surface 78 and seats against the circular flange 72 of he sleeve 64 when placed in a final seating position. In the final seating position, both the circular base surface 76 and the annular side surface 78 are encircled by the sleeve 64. A gasket 86 is positioned between the circular flange 72 and the annular flange 84 to ensure that there is a fluid-tight seal between them. The gas distribution assembly 46 includes a lid portion 88 that fits over the opening 80 and rests against the annular flange 84. A gasket 90 is disposed between the cover portion 88 and the annular flange 84 to form a fluid-tight seal between them.

Figure 6:
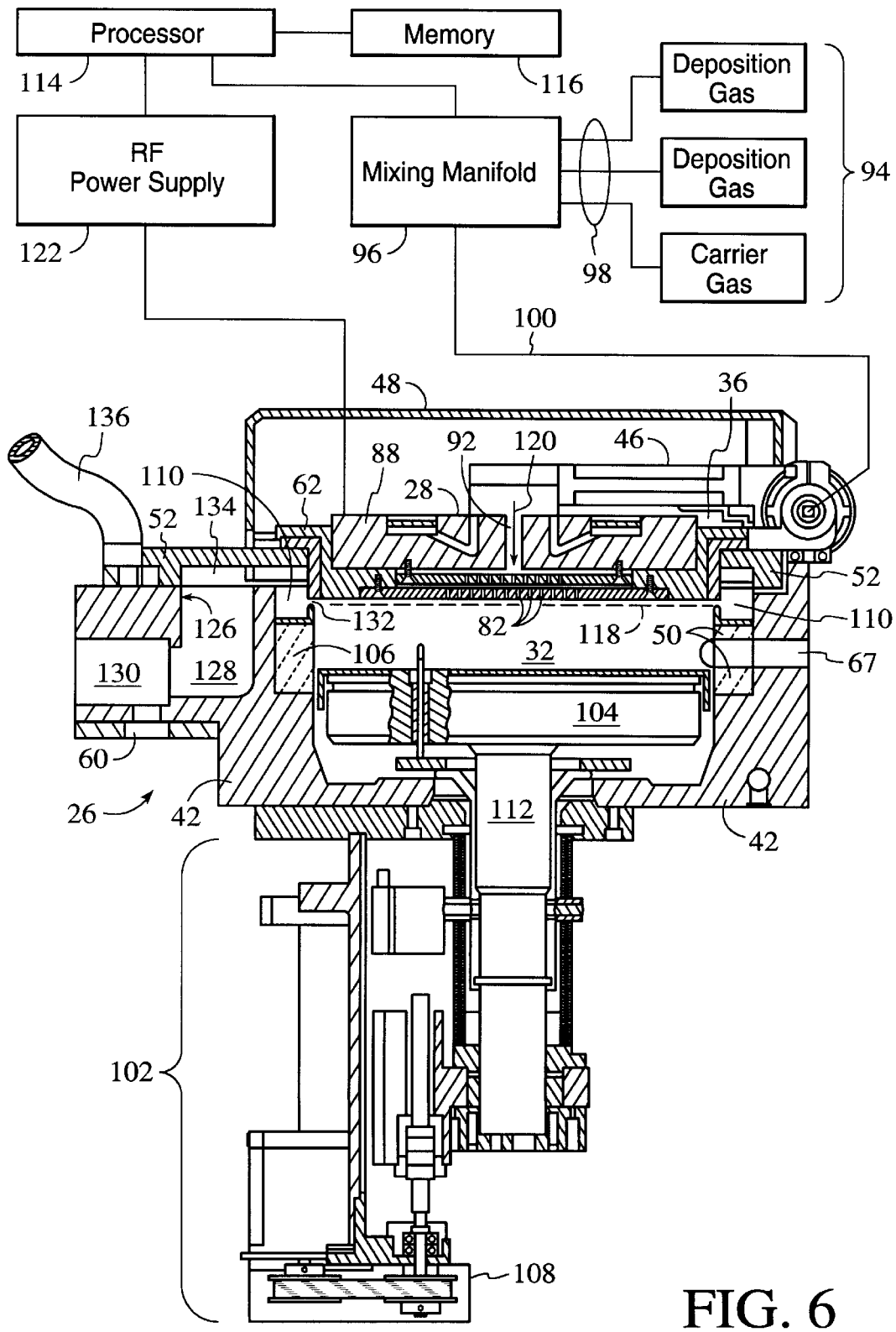
FIG. 6 is a cross-sectional views of the CVD apparatus shown above in FIG. 4.

Referring to FIG. 6, the gas distribution assembly 46 is attached to the lid portion 88 in any conventional manner, e.g., by bolting, brazing or the like. The lid portion 88 includes a throughway 92 to place the gas distribution assembly 46 in fluid communication with the process chamber 32. A supply 94 of deposition and carrier gases is in fluid communication with the gas distribution assembly 46 via a mixing manifold 96. Specifically, a plurality of supply lines 98 are coupled between the supply 94 and the mixing manifold 96. The carrier and deposition gases may be intermingled in the mixing manifold 96 before flowing into the gas distribution assembly 46 via conduit 100. Typically, the supply line for each supply of gas includes (i) several safety shut-off valves (not shown) that may be employed to terminate gas flow into the process chamber 32 either manually or automatically. Additionally, mass flow controllers (also not shown) may be employed to measure the flow of gas through each of the supply lines 98. This structure is particularly useful if the supply 94 includes a quantity of toxic gases.

Disposed within the process chamber 32 is a heater/lift assembly 102 coupled to a pedestal 104, and a process chamber liner 106. The pedestal 104 is positioned between the heater/lift assembly 102 and the vacuum lid 36, when the vacuum lid 36 is in the closed position. The heater lift assembly 102 is operably connected to a motor 108 to be moved controllably so as to vary the distance between the pedestal 104 and the vacuum lid 36. Information concerning the position of the pedestal 104 within the process chamber 32 is provided by a sensor (not shown). The process chamber liner 106 surrounds the pedestal 104 and defines a lower portion of an annular flow channel 110, with the upper portion of the annular flow channel 110 being defined by the vacuum lid 36. The pedestal 104 also includes resistively heated components, such as an embedded single-loop heater element (not shown) configured to make two full turns in the form of parallel concentric circles. An outer portion (not shown) of the heater element runs adjacent to a perimeter of the pedestal 104, while an inner portion runs on the path of a concentric circle having a smaller radius. The wiring to the heater element passes through the stem 112 of the heater/lift assembly 102.

Typically, any or all of the process chamber liner 106, gas dispersion plate 62 and various other apparatus 26 hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety. The pedestal 104 may be formed from any process-compatible material, including, aluminum, anodized aluminum, aluminum nitride, or aluminum oxide ($Al_2O_3$ or alumina).

A processor 114 is in electrical communication with the apparatus 26 to regulate the operations thereof. Typically, the processor 114 is part of a single-board computer (SBC), that includes analog and digital input/output boards, interface boards and stepper motor controller boards. Various components of the CVD apparatus 26 conform to the Versa Modular European (VME) standard, which defines board, card cage, as well as connector type and dimensions. The VME standard also defines the bus structure as having a 16-bit data bus and a 24-bit address bus. Functioning as a controller, the processor 114 executes system control software, which is a computer program stored in a memory 116, electronically coupled to processor 114. Any type of memory device may be employed, such as a hard disk drive, a floppy disk drive, a card rack or a combination thereof. The processor 114 operates under the control of the system control software, which includes sets of instructions that dictate the timing, mixture of gases, process chamber pressure, process chamber temperature, microwave power levels, pedestal position, and other parameters of a particular process, discussed more fully below with respect to FIG. 8.

Referring again to FIG. 6, during a deposition procedure, the vacuum lid 36 is placed in the closed position. The heater/lift assembly 102 places the support pedestal 104 in a processing position 118, disposed proximate to the vacuum lid 36. When placed in the processing position 118, the pedestal 104 is surrounded by the process chamber liner 106 and the annular flow channel 110. In this fashion, the pedestal 104 is located proximate to the gas distribution plate 62. Deposition and carrier gases are supplied via the supply lines 98 into the gas mixing manifold 96. The gas mixing manifold 96 causes the aforementioned gases to intermingle, forming the process gas, the path of which is shown as arrow 120. Specifically, the process gas flows through the conduit 100, into the gas distribution assembly 46, and through the apertures 82 in the gas dispersion plate 62. In this fashion, the process gas travels into the process chamber 32 and is vented toward the pedestal 104, where a wafer (not shown) would be positioned and is uniformly radially distributed across the wafer in a laminar flow.

The deposition process performed in CVD apparatus 26 is a thermal process in which the process gas mixture reacts thermally to deposit the desired films on the surface of a semiconductor wafer (not shown) supported on pedestal 104. Typically, the pedestal 104 is resistively heated to provide thermal energy for the reaction. During the deposition process it is beneficial to reduce the condensation of the process gases. To that end, a hot liquid is circulated through the walls 126 of the process chamber 32 to maintain the process chamber 32 at an elevated temperature. Fluids used to heat the process chamber walls 126 include the typical fluid types, i.e., water-based ethylene glycol or oil-based thermal transfer fluids. The aforementioned heating reduces the accumulation of volatile reactants in the process chamber 32 by reducing the condensation of the process gas on the walls 126 and in the aforementioned passages.

The portion of the process gas that is not deposited, or does not condense, is evacuated from the process chamber 32 by a vacuum pump (not shown). Specifically, the gases are exhausted through an annular slot 132 surrounding the process position 118, and then into the annular flow channel 110. The annular slot 132 and the annular flow channel 110 are defined by the gap between vacuum lid 36 and chamber liner 126. Both the annular slot 132 and the annular flow channel 110 have circular symmetry to provide uniform flow of process gases over the pedestal 104 so as to deposit a uniform film on the wafer (not shown).

From the annular flow channel 110, the gases flow through a lateral flow channel 134 in fluid communication therewith, past a viewing port (not shown), through the exhaust passageway 128, past the vacuum shut-off valve 130, and into an exhaust outlet 136 that connects to the external vacuum pump (not shown).

Figure 7:
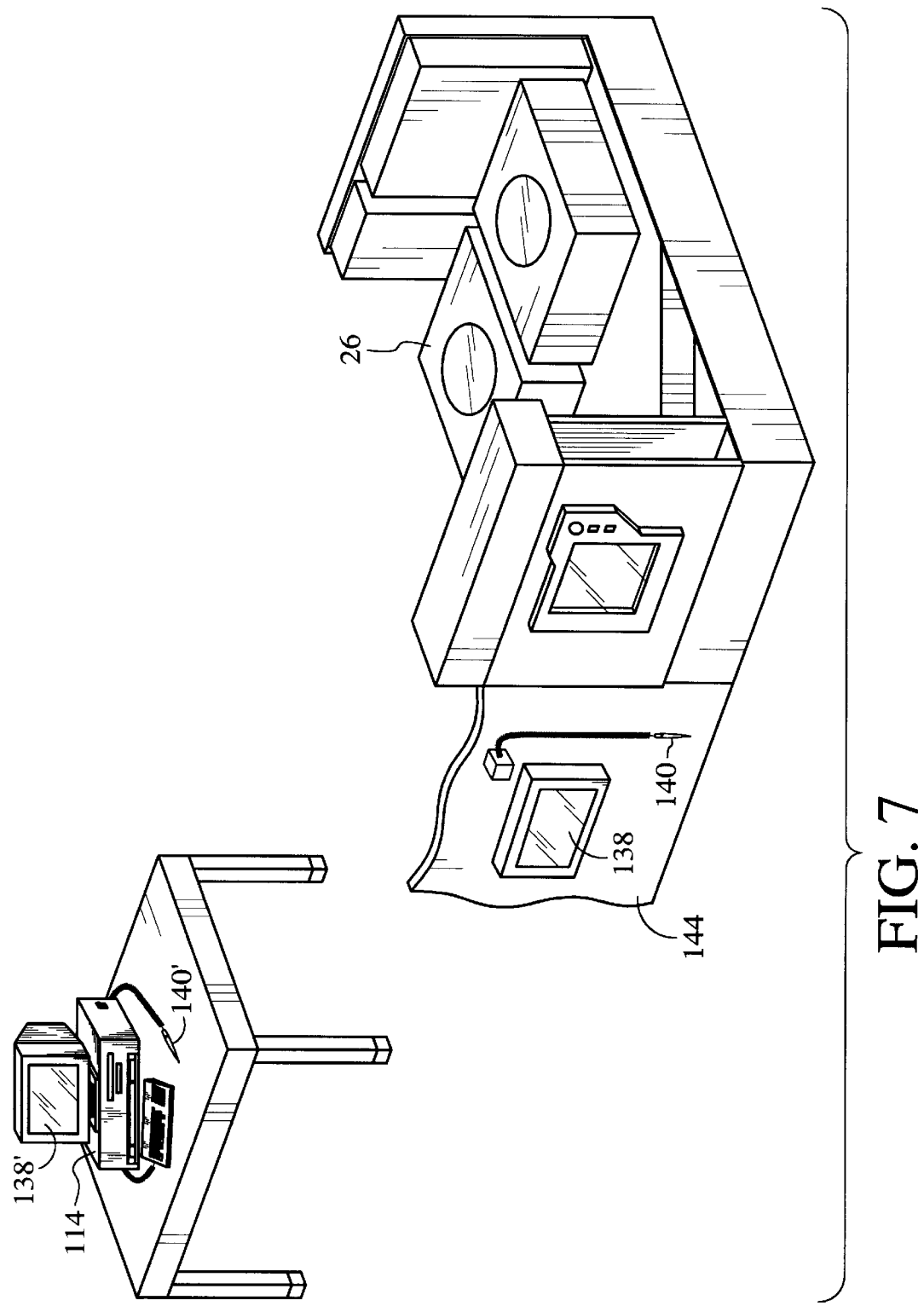
FIG. 7 is a simplified diagram of system monitor and a multichamber system employing one or more of the CVD apparatuses shown above in FIG. 4.

The interface between a user and the processor 114 is via a CRT monitor 138 and light pen 140, shown in FIG. 7, which is a simplified diagram of the CRT monitor and CVD apparatus 26 in a substrate processing system 142, which may include one or more process chambers. In the preferred embodiment two monitors 138 and 138l are used, one mounted in a clean room wall 144 for the operators and the other behind the wall for the service technicians. The CRT monitors 138 and 138' simultaneously display the same information, but only one light pen 140 is enabled for data input during any given time. A light sensor (not shown) in the tip of light pen 140 detects light emitted by the CRT monitor 138. To select a particular screen or function, the operator touches a designated area of the CRT monitor 138 and pushes a button (not shown) on the light pen 140. The touched area provides a visual response, such as a change in color, or a new menu or screen being displayed, confirming communication between the light pen 140 and the CRT monitor 138. Other input devices, such as a keyboard, mouse, or other pointing or communication device, may be used instead of or in addition to the light pen 140 to allow the user to communicate with the processor 114.

The process for depositing the film can be implemented using a computer program product that is executed by the processor 114. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer-usable medium, such as the memory 116, shown in FIG. 6. If the entered code text is in a high level language, the code is compiled, and the resultant compiler code is then linked with an object code of precompiled Windows™ library routines. To execute the linked, compiled object code the system user invokes the object code, causing the processor 114 to load the code in the memory 116. The precursor 114 then reads and executes the code to perform the tasks identified in the program.

Figure 8:
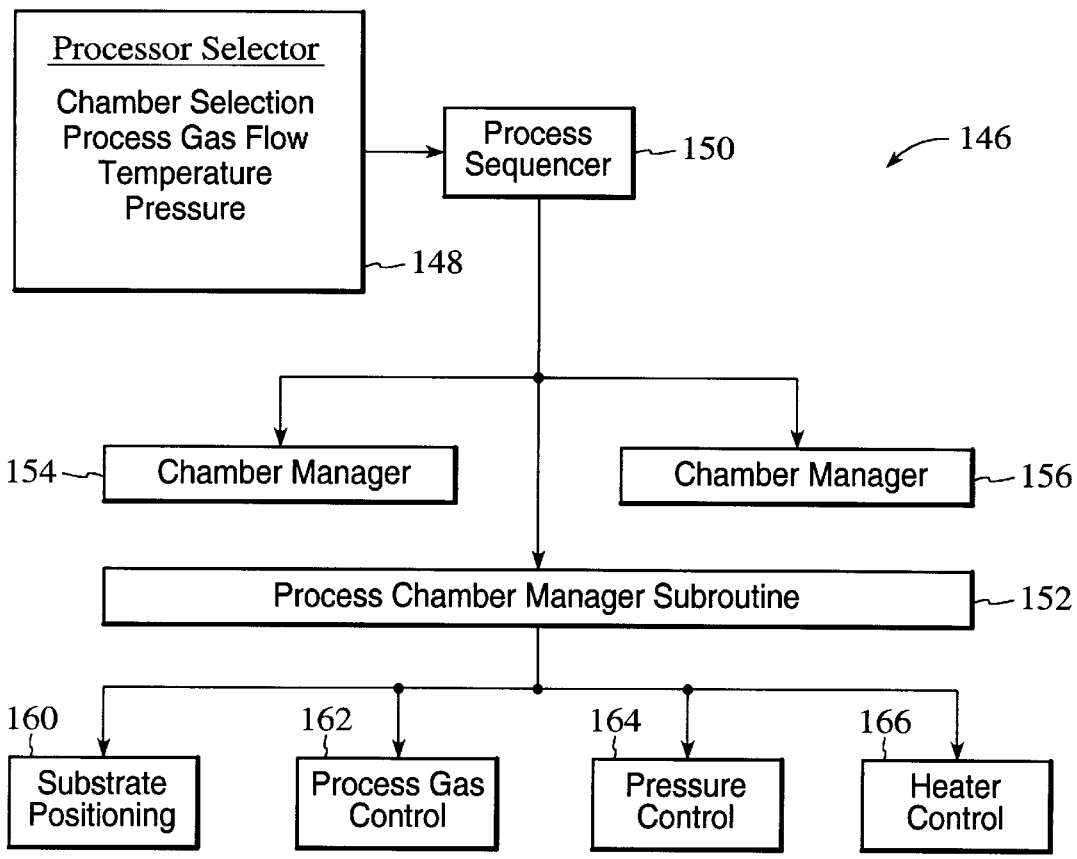
FIG. 8 is an illustrative block diagram of the hierarchical control structure of the system control software employed to control the operation of the CVD apparatus shown in FIG. 4.

Referring to both FIGS. 7 and 8, shown is an illustrative block diagram of the hierarchical control structure of the system control software, computer program 146, according to a specific embodiment. Using the light pen 140, a user enters a process set number and process chamber number into a process selector subroutine 148 in response to menus or screens displayed on the CRT monitor 138. The process sets are predetermined sets of process parameters necessary to carry out specified processes, and are identified by predefined set numbers. The process selector subroutine 148 identifies (i) the desired apparatus 26 and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low-frequency RF frequency, cooling gas pressure, and process chamber wall temperature. These parameters are provided to the user in the form of a recipe, and are entered utilizing the light pen/CRT monitor interface. The signals for monitoring the process are provided by the analog and digital input boards of the system controller, and the signals for controlling the process are output on the analog and digital output boards of CVD apparatus.

A process sequencer subroutine 150 comprises program code for accepting the identified process chamber and set of process parameters from the process selector subroutine 148, and for controlling operation of the various process chambers. Multiple users can enter process set numbers and process chamber numbers, or a user can enter multiple process set numbers and process chamber numbers, so the sequencer subroutine 150 operates to schedule the selected processes in the desired sequence. Preferably, the sequencer subroutine 150 includes a program code to perform the steps of (i) monitoring the operation of the process chambers to determine if the process chambers are being used, (ii) determining what processes are being carried out in the process chambers being used, and (iii) executing the desired process based on availability of a process chamber and type of process to be carried out. Conventional methods of monitoring the process chambers can be used, such as polling. When scheduling which process is to be executed, sequencer subroutine 150 takes into consideration the present condition of the process chamber being used in comparison with the desired process conditions for a selected process, or the "age" of each particular user-entered request, or any other relevant factor a system programmer desires to include for determining scheduling priorities.

Once the sequencer subroutine 150 determines which process chamber and process set combination is going to be executed next, the sequencer subroutine 150 initiates execution of the process set by passing the particular process set parameters to process chamber manager subroutines 152, 154 and 156, which control multiple processing tasks in the process chamber 32 according to the process set determined by the sequencer subroutine 150. For example, the process chamber manager subroutine 152 comprises program code for controlling the CVD process operations in the process chamber 32. The process chamber manager subroutines 152, 154 and 156 also control execution of various process chamber component subroutines that control operation of the process chamber components necessary to carry out the selected process set. Examples of process chamber component subroutines are substrate-positioning subroutine 160, process gas control subroutine 162, pressure control subroutine 164 and heater control subroutine 166. Those having ordinary skill in the art will readily recognize that other process chamber control subroutines can be included depending on what processes are to be performed in the process chamber 32. In operation, the process chamber manager subroutine 152 selectively schedules or calls the process component subroutines in accordance with the particular process set being executed. The process chamber manager subroutine 152 schedules the process component subroutines much like the sequencer subroutine 150 schedules which process chamber 32 and process set are to be executed next. Typically, the process chamber manager subroutine 152 includes steps of monitoring the various process chamber components, determining which components need to be operated based on the process parameters for the process set to be executed, and causing execution of a process chamber component subroutine responsive to the monitoring and determining steps.

Referring to both FIGS. 6 and 8, the substrate positioning subroutine 160 comprises program code for controlling process chamber components that are used to load the substrate (not shown) onto the pedestal 104 and, optionally, to lift a substrate (not shown), disposed thereon, to a desired height in the process chamber 32 to control the spacing between the substrate (not shown) and the gas distribution plate 62. When the substrate (not shown) is loaded into the process chamber 32, the pedestal 104 is lowered to receive the substrate, and thereafter, the pedestal 104 is raised to the desired height in the process chamber 32, to maintain the substrate (not shown) at a first distance or spacing from the gas distribution plate 62 during the CVD process. In operation, the substrate positioning subroutine 160 controls movement of the pedestal 104 in response to process set parameters related to the support height that are transferred from the process chamber manager subroutine 152.

The process gas control subroutine 162 has program code for controlling process gas composition and flow rates. The process gas control subroutine 162 controls the open/close position of the safety shut-off valves (not shown), and also ramps up/down the mass flow controllers to obtain the desired gas flow rate. The process gas control subroutine 162 is invoked by the process chamber manager subroutine 152, as are all process chamber component subroutines, and receives from the process chamber manager subroutine process parameters related to the desired gas flow rates.

Typically, the process gas control subroutine 162 operates by opening the gas supply lines and repeatedly (i) reading the necessary mass flow controllers, (ii) comparing the readings to the desired flow rates received from the process chamber manager subroutine 152, and (iii) adjusting the flow rates of the gas supply lines as necessary. Furthermore, the process gas control subroutine 162 includes steps for monitoring the gas flow rates for unsafe rates and for activating the safety shut-off valves when an unsafe condition is detected.

In some processes, an inert gas such as helium or argon is flowed into the process chamber 32 to stabilize the pressure in the process chamber before reactive process gases are introduced. For these processes, the process gas control subroutine 162 is programmed to include steps for flowing the inert gas into the process chamber 32 for an amount of time necessary to stabilize the pressure in the process chamber, and then the steps described above would be carried out. Additionally, when a process gas is to be vaporized from a liquid precursor, for example, TEOS, the process gas control subroutine 162 is written to include steps for injecting a delivery gas, such as helium, through the liquid precursor in liquid vaporizer-feeder, commonly referred to as a precision liquid injection system one of which in described in U.S. Pat. No. 5,272,880, which is incorporated by reference herein. As discussed above, the desired process gas flow rates are transferred to the process gas control subroutine 162 as process parameters. Furthermore, the process gas control subroutine 162 includes steps for controlling the operation of the aforementioned precision liquid injection system.

The pressure control subroutine 162 comprises program code for controlling the pressure in the process chamber 32 by regulating the size of the opening of the throttle valve in the exhaust system of the process chamber. The size of the opening of the throttle valve is set to control the process chamber pressure to the desired level in relation to the total process gas flow, size of the process chamber, and pumping set-point pressure for the exhaust system. When the pressure control subroutine 164 is invoked, the desired or target pressure level is received as a parameter from the process chamber manager subroutine 152. The pressure control subroutine 164 operates to measure the pressure in the process chamber 32 by reading one or more conventional pressure manometers connected to the process chamber, to compare the measure value(s) with the target pressure, to obtain PID (proportional, integral, and differential) values from a stored pressure table corresponding to the target pressure, and to adjust the throttle valve according to the PID values obtained from the pressure table. Alternatively, the pressure control subroutine 164 can be written to open or close the throttle valve to a particular opening size to regulate the process chamber 32 to the desired pressure.

The heater control subroutine 166 comprises program code for controlling the current to a heating unit that is used to heat the pedestal 104 and therefore, a substrate (not shown) disposed on the pedestal 104. The heater control subroutine 166 is also invoked by the process chamber manager subroutine 152 and receives a target or set-point temperature parameter. The heater control subroutine 166 measures the temperature by measuring voltage output of a thermocouple located in the pedestal 104, comparing the measured temperature with the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the pedestal 104, the heater control subroutine 166 gradually controls a ramp up/down of current applied to the loop. Additionally, a built-in fail-safe mode can be included to detect process safety compliance, and can shut down operation of the heating unit if the process chamber 32 is not properly set up.

A plasma control subroutine (not shown) may be included to set the low and high frequency RF power levels applied to process electrodes in the process chamber 32. In this fashion, a plasma cleaning procedure may be employed to remove residue from the interior surfaces of the process chamber 32. Similarly to the previously described process chamber component subroutines, the plasma control subroutine would be invoked by the process chamber manager subroutine 152.

The above reactor description is mainly for illustrative purposes, and variations of the above-described system may be employed. For example, the wafer could be supported by a pedestal and heated by quartz lamps. The layer and method for forming such a layer of the present invention is not limited to any specific apparatus.

II. Formation of A Phosphosilicate Glass Sacrificial Layer

The method of the present invention may be employed to deposit improved dielectric films, such as a PSG layer, in the exemplary CVD apparatus 26 described above with respect to FIG. 6. The method includes the step 170, shown in FIG. 9, of placing the substrate 172, shown in FIG. 10, in the deposition zone, located proximate to the processing position 118, shown in FIG. 6. Although the substrate 172, shown in FIG. 10, may have virtually any topography, the substrate 172 typically has a plurality of layers of film thereon that provides a substantially planar surface upon which the PSG layer is deposited. For purposes of this example, the substrate 172 is shown as having a plurality of layers suitable for formation of a cylindrically shaped capacitor associated with a DRAM integrated circuit. To that end, a dielectric layer, such as a layer of BPSG 174, is present. A layer of silicon nitride (SiN) 176 is disposed atop the BPSG layer. A layer of undoped silicon glass (USG) 178 is disposed atop of the silicon nitride layer. A contact via 180 extends from the USG layer 178 and completely through both the BPSG layer 174 and the SiN layer, terminating proximate to a source/drain region (not shown). Poly-silicon material is deposited in the contact via 180 and forms a polysilicon layer 182 atop of the USG layer 178.

Figure 9:
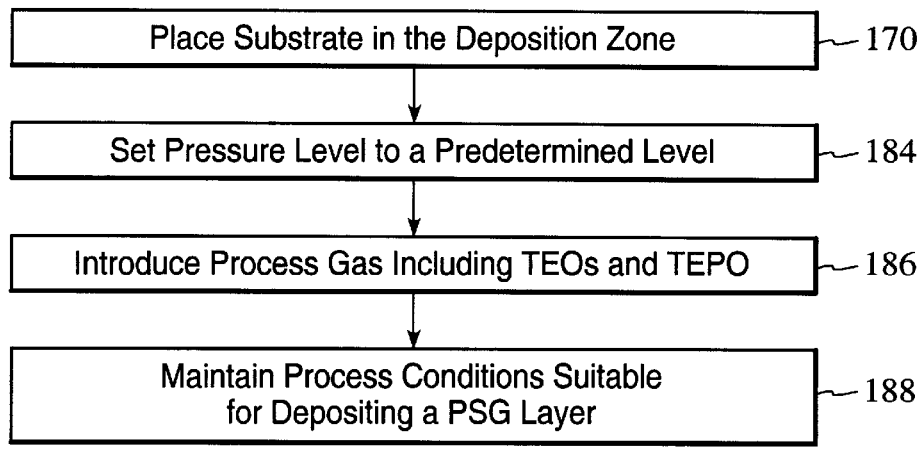
FIG. 9 is a flow chart illustrating the steps of a preferred embodiment of the present invention.
Figure 10:
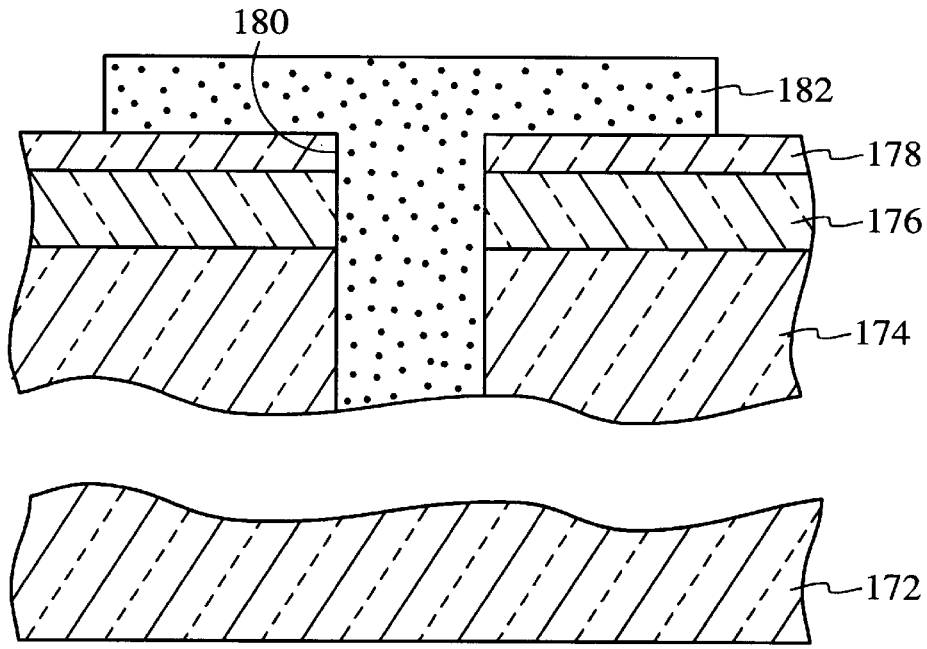
FIG. 10 is a cross-sectional view of a portion of an integrated circuit in which a dielectric layer is deposited in accordance with the present invention.

Referring to FIG. 9, at step 184 the pressure in the process chamber 32, shown in FIG. 6, is set to a predetermined level. At step 186, shown in FIG. 9, a process gas including a silicon source, an oxygen source, and a phosphorous source is flowed into the deposition zone, and at step 188, the process conditions of the apparatus 26, shown in FIG. 6, are maintained at a condition suitable for depositing a phosphosilicate glass layer on the substrate 172, shown in FIG. 10. The pressure level set a step 184, shown in FIG. 9, is based upon the discovery that a wet-etch rate of a subsequently deposited PSG layer 190, shown in FIG. 11, is dependent upon the pressure maintained within the process chamber 32 during deposition of the PSG layer 190.

Figure 1:
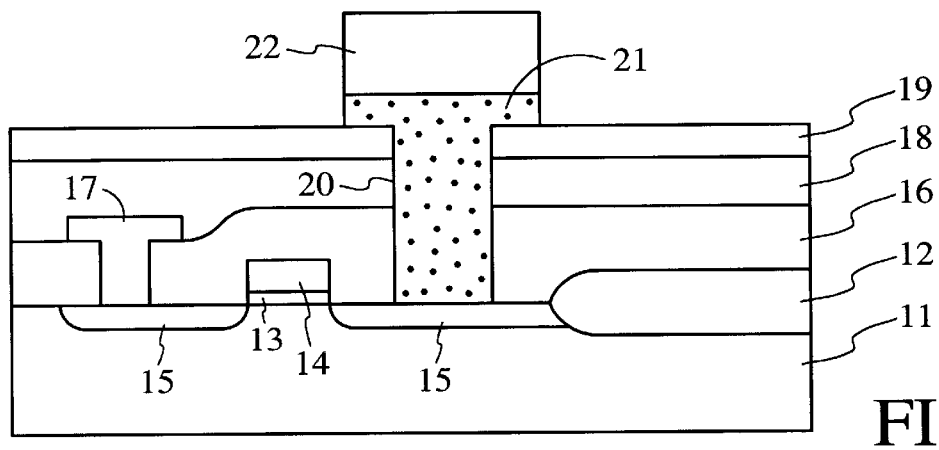
FIGS. 1–3 are cross-sectional views illustrating a conventional process for fabricating a capacitor of an integrated circuit.
Figure 2:
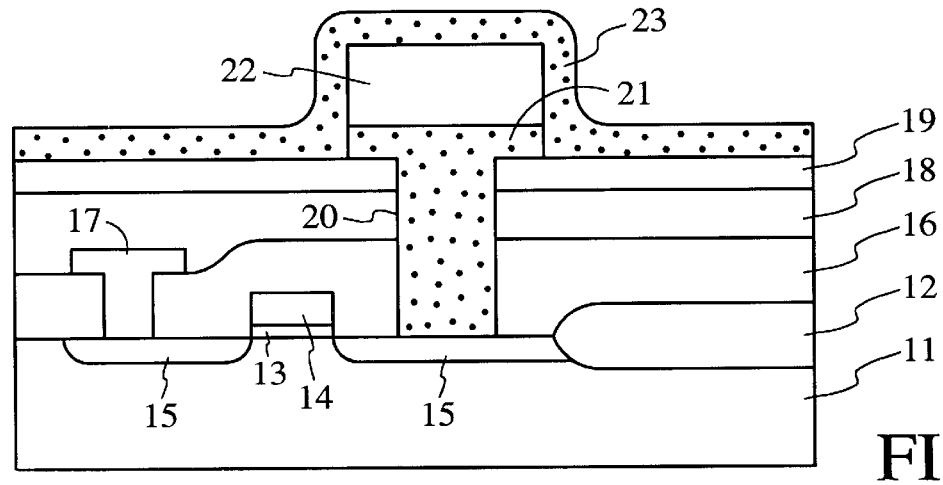
Figure 3:
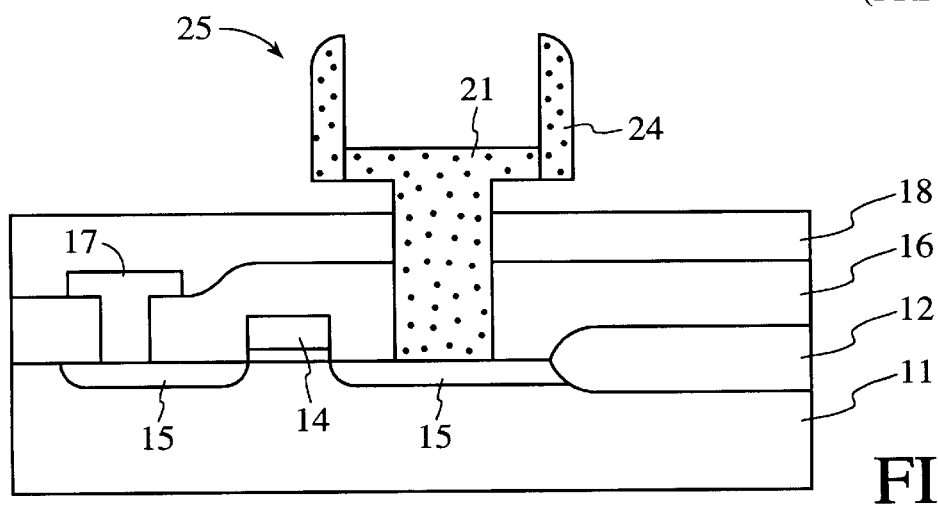
Figure 11:
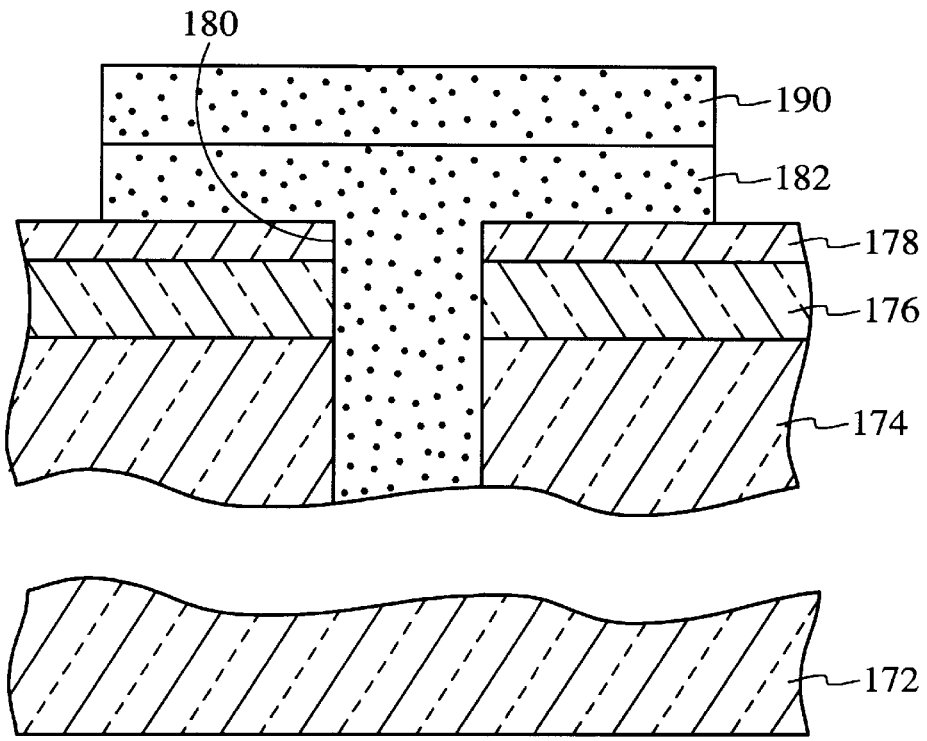
FIG. 11 is a cross-sectional view of the integrated circuit shown in FIG. 10 with a dielectric layer disposed thereon in accordance with the present invention.
Figure 12:
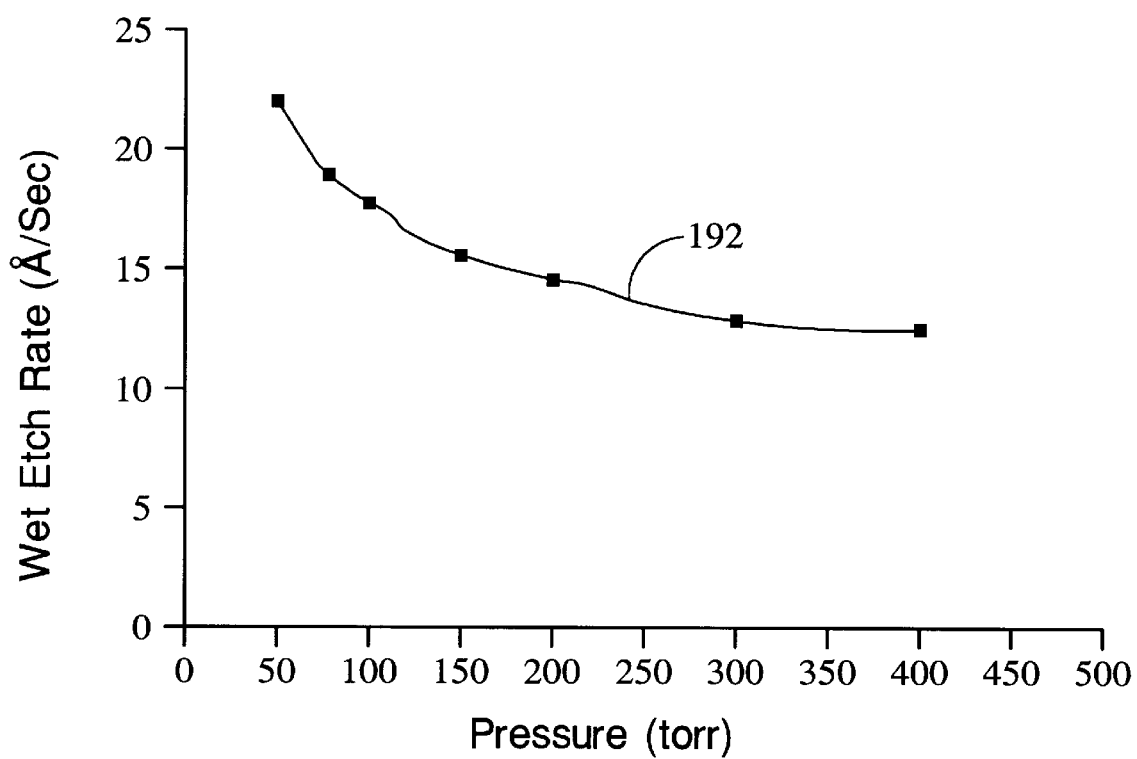
FIG. 12 is a graph depicting the wet-etch rate of the dielectric layer, shown in FIG. 11 versus the pressure at which the aforementioned dielectric layer is deposited.

As shown in FIG. 12, the slope of curve 192 indicates that the lower the pressure in the process chamber 32, shown in FIG. 6, the higher the wet-etch rate of the PSG layer 190, shown in FIG. 11. For example, employing a buffered hydrofluoric acid BHF (50:1) etchant at 18° C., the wet-etch rate of the PSG layer 190, deposited with the chamber pressurized to approximately 50 torr, was in excess of 20 Å per second. A PSG layer deposited with the chamber pressurized to approximately 300 torr, and subjected to a similar etching process, demonstrates an etch rate below 15 Å per second. At pressures greater than 400 torr, however, there was no appreciable difference in the wet-etch rate of the PSG layer 190. Therefore, at pressures 400 torr and below, the wet-etch rate of the PSG layer 190 may be controlled within a predetermined range. This provides the added advantage of increasing the rapidity at which a PSG layer may be etched, thereby decreasing the time to manufacture the integrated circuit associated therewith, were the PSG layer 190 used as a sacrificial layer during the manufacture of the integrated circuits. For example, during the manufacture of the cylindrical capacitors associated with certain DRAM integrated circuits, certain sacrificial layers must be deposited to mask the circuit in order to form the requisite structure. As shown in FIGS. 1 and 2, the sacrificial layer 22 is employed so that the side walls of the electrode may follow the contour of the same. Thereafter, during an etch process, the sacrificial layer 22 is sacrificed by being etched away while masking the first polysilicon pattern 21. By forming the sacrificial layer 22 from the PSG layer in accordance with the claimed invention, the time needed to etch the same may be significantly reduced. Thus, the time required to manufacture the DRAM integrated circuit may be decreased, thereby decreasing the per unit circuit costs of a DRAM integrated circuit.

In an exemplary embodiment, the silicon source is vaporized TEOS, the phosphorous source is vaporized TEPO, the oxygen source includes 12% ozone gas with the remaining portion of the oxygen source comprising molecular oxygen, $O_2$. A carrier gas comprising pure helium is included. The TEOS is flowed into the deposition zone at a rate in the range of 700 to 1,500 sccm, with 1,200 sccm being preferred. The TEPO gas is flowed into the deposition zone at the rate in the range of 30 to 150 sccm, with 80 sccm being preferred. The ozone gas is flowed into the deposition at a rate in the range of 3,000 to 6,000 sccm, with 4,000 sccm being preferred. The helium gas is flowed into the deposition zone at a rate in the range of 2,000 to 6,000, with 4,000 sccm being preferred. The temperature of the deposition zone is in the range of 350° C. to 500° C., with 480° C. being preferred. The pressure is maintained within a critical range so as not to exceed 400 torr to control the wet-etch rate of the PSG layer. By ensuring that the pressure is maintained within a critical range of less than 400 torr, the wet-etch rate of the PSG layer formed could be regulated, allowing the manufacture of integrated circuits, such as DRAMs, at a reduced per unit cost.

Figure 13:
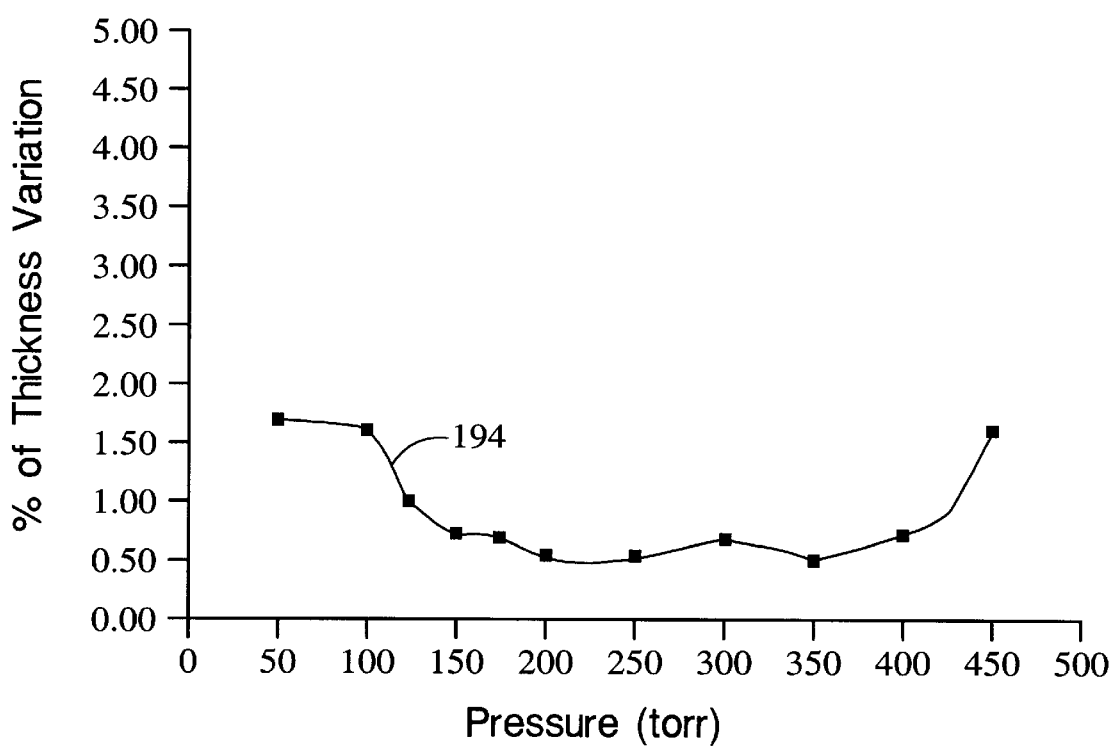
FIG. 13 is a graph depicting the uniformity of the dielectric layer, shown in FIG. 11, versus the pressure at which the aforementioned dielectric layer is deposited.

Referring to both FIGS. 6 and 13, another embodiment of the present invention takes advantage of a newly discovered relationship between chamber pressure and thickness uniformity of the PSG layer 190 formed from a process gas including a silicon source, an oxygen source, and a phosphorous source flowed into the deposition zone as discussed above. Thickness uniformity is particularly important so as to prevent over etch of a layer underlying the PSG layer 190. The thickness uniformity is determined as follows:

$$T = (T_{max} - T_{min})/2T_{avg}$$

where T is the thickness, $T_{max}$ is the maximum thickness measured, $T_{min}$ is the minimum thickness measured and $T_{avg}$ is the average thickness of the PSG layer. Examining the curve 194, which represents the thickness of the PSG layer 190 measured at nine different points, it is seen that within the atmospheric pressure range, 125 torr to 400 torr, the thickness uniformity varies by less than 1%. Pressure levels below 125 torr demonstrate a thickness variation in excess of 1%, as does any pressure level above 400 torr. The slope of the curve 194 indicates that the thickness variation will worsen the lower the pressure level is below 100 torr, and the higher the pressure level is above 400 torr. Therefore, by maintaining the atmospheric pressure, during deposition of the PSG layer 190, in the range of 125 torr to 400 torr, inclusive, a control of the wet-etch rate of the same may be achieved while providing superior thickness uniformity. However, if superior thickness uniformity is not desired, the wet-etch rate of the PSG layer 190 may be easily controlled by lowering the atmospheric pressure to less than 400 torr, for the reasons discussed above. In this fashion, a PSG layer with a substantially improved wet-etch rate may be formed, thereby allowing the manufacture of integrated circuits, such as DRAMs, at a reduced per unit cost.

Although the carrier gas discussed above has been described as being a helium gas, a combination carrier gas may be employed in lieu of the helium gas. One example of such a combination carrier gas includes a helium-nitrogen ($He/N_2$) mixture. Each of the gases of the helium-nitrogen mixture would be flowed into the deposition zone at a rate in the range of 1,000 to 3,000 sccm. It is preferable, however, that the helium gas be flowed into the deposition zone at the same rate as the nitrogen gas, approximately 2,000 sccm. The scope of the invention should, therefore, be determined not with reference to the above description, but instead should be determined with reference to the appended claims along with their full scope of equivalents.

What is claimed is:

1. A method for depositing a dielectric layer, having a thickness variation, on a substrate positioned proximate to a deposition zone of a semiconductor process chamber, said method comprising the steps of:

flowing, into said process chamber, a process gas including a silicon source, an oxygen source, and a phosphorous source;

establishing said thickness variation by pressurizing said process chamber to a preset pressure level, said preset pressure level being no greater than 400 torr and no less than 125 torr; and maintaining said deposition zone at process conditions suitable for depositing a phosphosilicate glass layer on said substrate.

2. The method as recited in claim 1 wherein said phosphorous source includes triethylphosphate.

3. The method as recited in claim 1 wherein said silicon source includes tetraethylorthosilicate.

4. The method as recited in claim 1 wherein said oxygen source includes ozone.

5. The method as recited in claim 1 wherein a process chamber temperature is in the range of 300° C. to 500° C.

6. The method as recited in claim 1 wherein said process gas includes a carrier gas comprising helium.

7. The method as recited in claim 1 wherein said process gas includes a carrier gas comprising a mixture of helium and nitrogen gases.

8. A method for depositing a dielectric layer on a substrate positioned proximate to a deposition zone of a semiconductor process chamber, said method comprising the steps of:

flowing, into said process chamber, a process gas including a silicon source, an oxygen source, and TEPO;

pressurizing said process chamber to a level in the range of 125 torr to 400 torr, inclusive; and maintaining said deposition zone at process conditions suitable for depositing a phosphosilicate glass layer on said substrate.

9. The method as recited in claim 8 wherein said silicon source includes tetraethylorthosilicate.

10. The method as recited in claim 8 wherein said oxygen source includes ozone.

11. The method as recited in claim 8 wherein said temperature is in the range of 300° C. to 500° C.

12. The method as recited in claim 8 wherein said substrate includes a plurality of layers of film disposed thereon defining a substantially planar surface.

13. The method as recited in claim 8 wherein said process gas includes a carrier gas comprising helium.

14. The method as recited in claim 8 wherein said process gas includes a carrier gas comprising a mixture of helium and nitrogen gases.

* * * * *